United States Patent
Sudo

(10) Patent No.: US 7,398,447 B2
(45) Date of Patent: Jul. 8, 2008

(54) INTERCOMMUNICATING APPARATUS FOR DUPLEX SYSTEM CAPABLE OF DETECTING FAILURE THEREOF

(75) Inventor: Hirofumi Sudo, Tokyo (JP)

(73) Assignee: NEC Corporation, Tokyo (JP)

( * ) Notice: Subject to any disclaimer, the term of this patent is extended or adjusted under 35 U.S.C. 154(b) by 19 days.

(21) Appl. No.: 11/337,605

(22) Filed: Jan. 24, 2006

(65) Prior Publication Data

US 2006/0156186 A1    Jul. 13, 2006

Related U.S. Application Data

(62) Division of application No. 10/081,190, filed on Feb. 25, 2002, now Pat. No. 7,028,242.

(30) Foreign Application Priority Data

Feb. 23, 2001  (JP)  ............... 2001-049361

(51) Int. Cl.
  *H03M 13/00*  (2006.01)
(52) U.S. Cl. .................. 714/758; 714/799
(58) Field of Classification Search ........... 714/758, 714/799
  See application file for complete search history.

(56) References Cited

U.S. PATENT DOCUMENTS

| | | | |
|---|---|---|---|
| 3,760,127 A | 9/1973 | Camiciottoli et al. | |
| 3,872,257 A | 3/1975 | Bleickardt et al. | |
| 4,250,563 A * | 2/1981 | Struger | 710/63 |
| 4,404,602 A | 9/1983 | Hoshimi et al. | |
| 4,433,415 A * | 2/1984 | Kojima | 714/755 |
| 4,446,490 A | 5/1984 | Hoshimi et al. | |
| 4,459,696 A | 7/1984 | Kojima | |
| 4,933,930 A * | 6/1990 | Lien et al. | 370/441 |
| 5,276,848 A * | 1/1994 | Gallagher et al. | 711/121 |
| 6,188,702 B1 | 2/2001 | Tornetta et al. | |

FOREIGN PATENT DOCUMENTS

| | | |
|---|---|---|
| JP | A 59-172836 | 9/1984 |
| JP | 6-152571 | 5/1994 |
| JP | 10-11390 | 1/1998 |
| JP | 2000-47892 | 2/2000 |
| WO | 01/13566 | 2/2001 |

* cited by examiner

*Primary Examiner*—Joseph D. Torres
(74) *Attorney, Agent, or Firm*—Young & Thompson

(57) ABSTRACT

A parity generating circuit in a 0 side receives input signals on respective signal lines and produces a parity bit based on the input signals. A parallel/serial converting circuit multiplexes parallel signals (or input signals) and the parity bit into a serial signal with reference to a timing signal. A serial/parallel converting circuit in a 1 side reproduces parallel signals and a parity signal and produces a parity check timing signal. A parity checking circuit checks a parity of the parallel signals by the use of the parity signal. If normal, a state holding circuit holds outputs of the parity checking circuit as a state signal. If abnormal, held content of the state holding circuit is cleared.

19 Claims, 5 Drawing Sheets

INTERCOMMUNICATING APPARATUS FOR DUPLEX SYSTEM CAPABLE OF DETECTING FAILURE THEREOF

This application is a division of co-pending application Ser. No. 10/081,190, filed on Feb. 25, 2002, the entire contents of which are hereby incorporated by reference.

BACKGROUND OF THE INVENTION

This invention relates to an intercommunicating apparatus for a duplex system, in particular, to an intercommunicating apparatus and an intercommunicating method capable of detecting an abnormality of intercommunicating information between processor boards in a duplex processor apparatus.

In a duplex processor apparatus (or system) in which two processor units are used as mates (i.e. active and standby processor systems), the processor units intercommunicate various kinds of information signals between them to make possible to be switched one to another upon occurrence of a failure in the active processor system.

Presently, the processor boards on which processor units are mounted individually have intercommunicating portions connected to each other with cables or buses and forming an intercommunicating apparatus for transmitting and receiving the information signals.

The information signals must be transmitted and received between the intercommunicating portions without fail. Thus, the existing intercommunicating apparatus is designed so as to detect cable disconnection for the cables between the intercommunicating portions.

However, the existing intercommunicating apparatus has a problem that it can not deal with a failure except for the cable disconnection.

SUMMARY OF THE INVENTION

It is therefore an object of this invention to provide intercommunicating apparatus which can deal with a failure thereof.

Other object of this invention will become clear as the description proceeds.

On describing the gist of an aspect of this invention, it is possible to understand that an intercommunicating apparatus transmits a plurality of intercommunicating signals parallel to one another from a first processor unit to a second processor unit of a duplex processor apparatus.

According to the aspect of this invention, the intercommunicating apparatus comprises an output driver connected to the first processor unit to transmit the intercommunicating signals supplied from the first processor unit in the form of a serial signal having a redundancy data structure. An input driver is connected to the output driver and the second processor unit and receives the serial signal transmitted from the output driver to reproduce the intercommunicating signals in the form of parallel signals and to supply the reproduced intercommunicating signals to the second processor unit.

In the intercommunicating apparatus, the output driver comprises a coding circuit to produce an error detecting code signal as the serial signal. The input driver comprises an decoding circuit and decode the error detecting code signal to detect an error on the error detecting code signal. The decoding circuit suspends supply of the reproduced intercommunicating signals to the second processor unit when the error is detected.

Furthermore, the cording circuit comprises a redundancy bit producing circuit connected to the first processor unit for producing at least one redundancy bit on the basis of the intercommunicating signals. A multiplexing circuit is connected to the redundancy bit producing circuit to multiplex the intercommunicating signals and the redundancy bit(s) in a predetermined cycle to produce the serial signal. The decoding circuit comprises a demultiplexing circuit connected to the multiplexing circuit to demultiplex the serial signal into received intercommunicating signals and received redundancy bit(s). An error detecting circuit is connected to the demultiplexing circuit to detect an error on the received intercommunicating signals by the use of the received redundancy bit(s). A signal holding circuit is connected to the error detecting circuit and said second processor unit. The signal holding circuit holds the received intercommunicating signals to supply the received intercommunicating signals as the reproduced intercommunicating signals to the second processor unit.

According to another aspect of this invention, a method for transmitting a plurality of intercommunicating signals parallel to one another from a first processor unit to a second processor unit of a duplex processor apparatus comprises the steps of changing the intercommunicating signals supplied from the first processor unit into a serial signal having a redundancy data structure, reproducing the intercommunicating signals in the form of parallel signals from the serial signal, and supplying the reproduced intercommunicating signals to the second processor unit.

In the above mentioned method, the serial signal comprises an error detecting code signal. The method further comprises the steps of detecting an error on said error detecting code signal, and suspending supply of the reproduced intercommunicating signals to the second processor unit when the error is detected.

Particularly, in the method, the changing step comprises the steps of producing at least one redundancy bit on the basis of the intercommunicating signals, and multiplexing the intercommunicating signals and the redundancy bit(s) in a predetermined cycle to produce the serial signal. The reproducing step comprises the steps of demultiplexing the serial signal into received intercommunicating signals and received redundancy bit(s), detecting an error on the received intercommunicating signals by the use of the received redundancy bit(s), and holding the received intercommunicating signals in a signal holding circuit to supply the received intercommunicating signals as the reproduced intercommunicating signals to the second processor unit.

DESCRIPTION OF THE PREFERRED EMBODIMENTS

Figure 1:
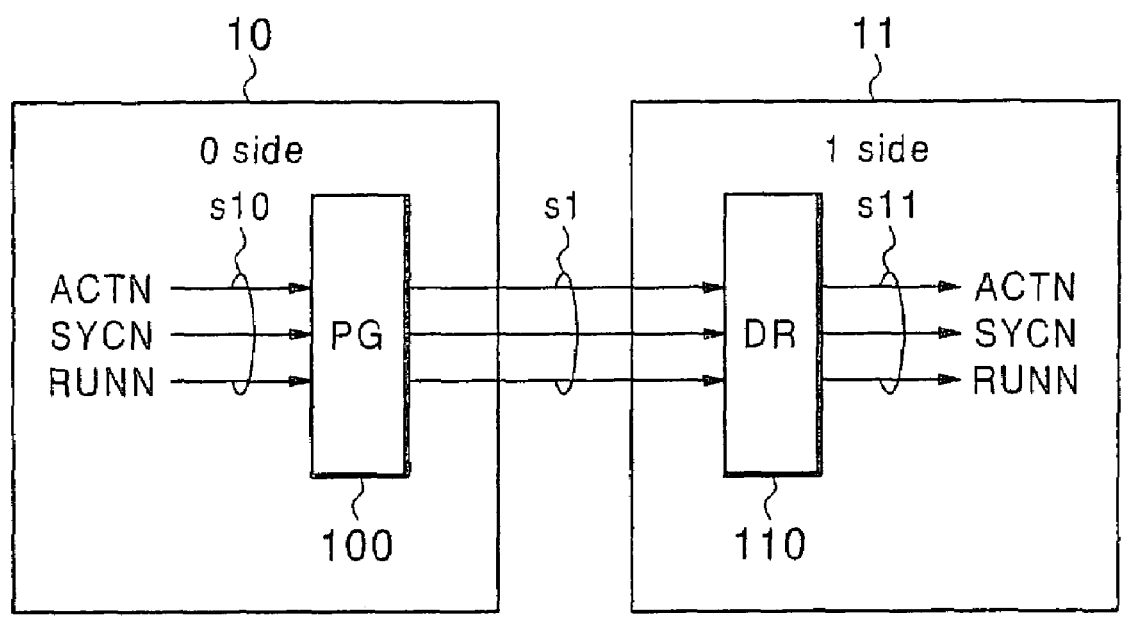
FIG. 1 is a block diagram of an existing intercommunicating apparatus.

Referring to FIG. 1, description will be at first directed to an existing intercommunicating apparatus for a better understanding of this invention.

In FIG. 1, the existing intercommunicating apparatus comprises intercommunicating portions 0 side 10 and 1 side 11. The intercommunicating portions 10 and 11 are individually provided on processor boards on which processor units are mounted. The processor boards are connected to a common back wiring board (not shown) or a common printed wiring board (not shown) to form a duplex processor apparatus.

Therefore, the intercommunicating portions 10 and 11 are connected to each other via a plurality of cables or buses attached to the back wiring board or formed on the printed wiring board.

The intercommunicating portions 10 and 11 have bus drivers for transmitting and receiving operation mode signals s10 and s11 to prepare for switching between an active system and a standby system of the duplex processor apparatus. In the intercommunicating apparatus of FIG. 1, the bus driver of the intercommunicating portion 10 comprises a pulse generator 100 while the bus driver of the intercommunicating portion 11 comprises a data receiver 110. The operation mode signals s10 include, for example, a signal (ACTN) representative of being an active system, a signal (SYCN) representative of being in a duplex operation, and a signal (RUNN) representative of the processor being in execution.

Though the structure for transmitting the operation mode signals s10 and s11 from the intercommunicating portion 10 to the intercommunicating portion 11 is merely illustrated in FIG. 1, the intercommunicating apparatus further comprises additional bus drivers (not show) for transmitting and receiving other operation mode signals from the intercommunicating portion 11 to the intercommunicating portion 10. However, explanation of the additional bus drivers is omitted to simplify the description of this invention.

In the duplex processor apparatus, it is required to cause no abnormal operation upon occurrence of a failure in the intercommunicating apparatus. It is true of a case where the buses are partially or entirely disconnected from the intercommunicating portion 10 and/or 11.

The operation mode signals s10 and s11 are transmitted and received as individual signals s1 through the buses in the existing intercommunicating apparatus. Therefore, there is a case where one or more of the operation mode signal(s) is(/are) not transmitted or received by one of the intercommunicating portions 10 and 11 when buses is partially or entirely disconnected from the intercommunicating portion 10 and/or 11. In such a case, there is a possibility of abnormal operation in the duplex processor apparatus The duplex processor apparatus should also carry out a normal operation in such a case.

In order to meet such requirement, for example, Japanese Unexamined Patent Publication (A) No. S59-172836 proposes to detect cable disconnection for the cables connecting the intercommunicating portions, thereby preventing occurrence of a state abnormality in the duplex processor apparatus.

However, the method disclosed in the above mentioned prior art document can not detect and deal with other failures than the cable disconnection, for example, a failure of the intercommunicating apparatus or the back (or printed) wiring board.

Thus, in case where the failure causes a trouble such that a certain operation mode signal is fixed to a high level or a low level on a cable between the intercommunicating portions, a receiving side of the processor units causes a state abnormality in its operation for the duplex processor apparatus. For example, it is indefinite which processor unit should be the active system and a normal duplex operation can not be carried out in the duplex processor apparatus.

In addition, in a case where the receiving side is the standby system, it can not prepare an initial condition for being switched into the active system. That is, a normal duplex operation can not be carried out in this case.

Furthermore, in the existing method, the active system is indefinite in the above-mentioned case. Therefore, it is impossible to start the duplex processor apparatus with one system (as a simplex processor apparatus). This may possibly cause system down.

Still furthermore, it is assumed that a case where an additional processor board is inserted into a module performing a normal operation as a simplex processor apparatus to form the duplex processor apparatus. In this case, if the additional processor board has a failure such that one or more operation mode signals provided from an intercommunicating portion mounted thereon are fixed to the high or low level, the system down may be possibly caused in the duplex processor apparatus.

Figure 2:
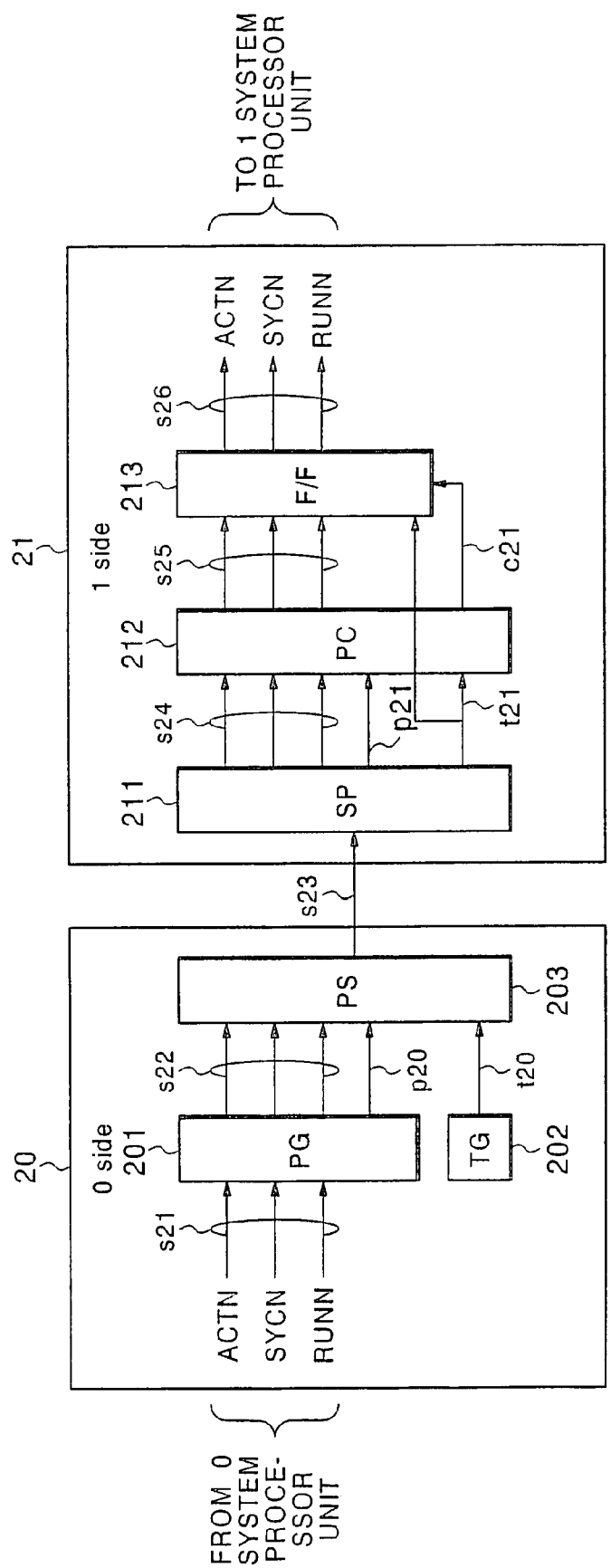
FIG. 2 is a block diagram of an intercommunicating apparatus according to a preferred embodiment of this invention.
Figure 3:
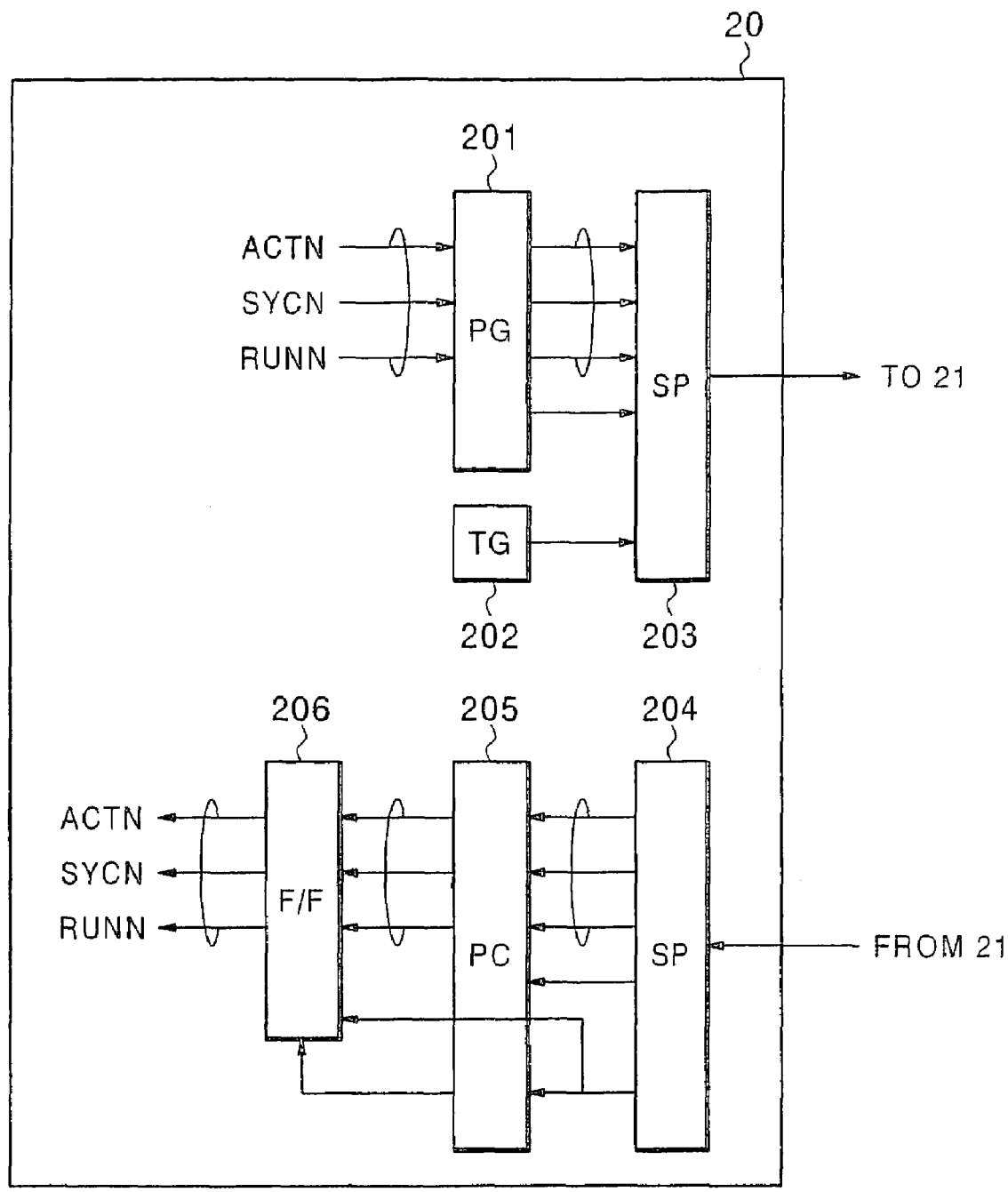
FIG. 3 is a block diagram of an intercommunication portion used in the intercommunicating apparatus of FIG. 2.
Figure 4:
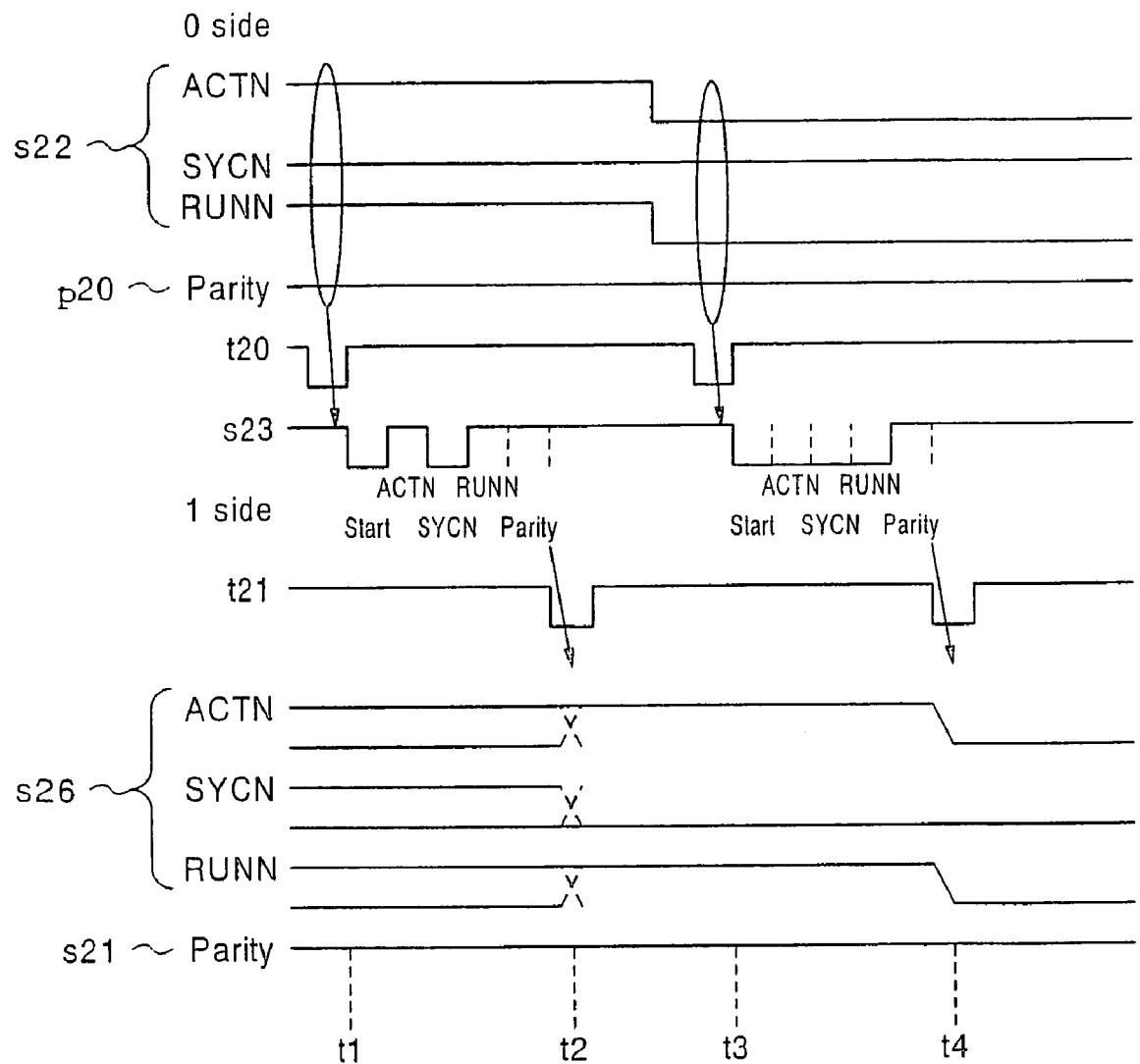
FIG. 4 is a time chart for describing an operation of the intercommunicating apparatus of FIG. 2.

Referring to FIGS. 2 through 4, the description will proceed to an intercommunicating apparatus according to a preferred embodiment of this invention.

FIG. 2 is a block diagram showing the intercommunicating apparatus according to the preferred embodiment of this invention.

In FIG. 2, the intercommunicating apparatus comprises intercommunicating portions 0 side 20 (hereinafter may also be referred to as "0 system") and 1 side 21 (hereinafter may also be referred to as "1 system") and a bus or a line connecting the intercommunicating portions 20 and 21 with each other. The intercommunicating portions 0 side 20 and 1 side 21 corresponds to a 0 system unit (or a 0 system processor board) (not shown) and a 1 system unit (or a 1 system processor board) (not shown) of a duplex processor apparatus, respectively. The intercommunicating portions 20 and 21 are generally mounted on the processor boards individually. The bus is generally attached to the back wiring board on with connectors for receiving the processor boards are mounted. The bus may be formed on a printed wiring board which is connectable to the processor boards and different from the back wiring board.

The intercommunicating portion 0 side 20 has a transmitting side (or output) driver which comprises a parity generating circuit 201 as a redundancy bit producing circuit, a timing generating circuit 202, and a parallel/serial converting circuit 203 as a multiplexing circuit. The output driver serves as a coding circuit. The parity generating circuit 201, the timing generating circuit 202 and the parallel/serial converting circuit 203 may be formed in a single chip. In such a case, the intercommunicating portion 20 is simplified in production thereof and avoids carrying out an abnormal operation caused by bad connection among them.

On the other hand, the intercommunicating portion 1 side 21 has a receiving side (or input) driver which comprises a serial/parallel converting circuit 211 as a demultiplexing circuit, a parity checking circuit 212 as a error detecting circuit, and a state holding circuit 213 for holding an operating state information of the 0 system as a mate system. The input driver serves as decoding circuit. The serial/parallel converting circuit 211 and the state holding circuit 213 may be formed in a single chip. In such a case, the intercommunicating portion 21 is simplified in production thereof and avoids carrying out an abnormal operation caused by bad connection among them.

Though the circuits for transmitting a signal from the 0 system 20 to the 1 system 21 is merely illustrated in FIG. 2, the intercommunicating portions 20 and 21 comprise similar circuits for transmitting another signal from the 1 system 21 to the 0 system 20. That is, the intercommunicating portion 20 is structured as illustrated in FIG. 3 while the intercommunicating portion 21 is similar to the intercommunicating portion 20.

As shown in FIG. 3, the intercommunicating portion 20 has an additional receiving side driver which comprises a serial/parallel converting circuit 204, a parity checking circuit 205, and a state holding circuit 206 in addition to the transmitting side driver illustrated in FIG. 2.

For convenience, description will hereinafter be made of the structure and the operation of this embodiment in conjunction with the structure illustrated in FIG. 2.

Referring to FIG. 2, in the intercommunicating portion 0 side 20, the parity generating circuit 201 is supplied with intercommunicating signals s21 such as operation mode signals on respective signal lines. The operation mode signals are used for defining the active and the standby systems in the duplex processor apparatus. In other words, the operation mode signals define an operation of each processor board of the duplex processor apparatus. In the embodiment of FIG. 2, the operation mode signals include a signal ACTN representative of an active system (active system being indicated by a low level), a signal SYNC representative of a duplex operation state (duplex operation being indicated by a low level), and a signal RUNN representative of being in execution (in execution being indicated by a low level).

The parity generating circuit 201 produces a parity bit p20 as a redundant bit(s) based on the signals s21. For example, the parity bit p20 is decided so that the number of high levels of the signals s21 is equal to an odd number. The parity generating circuit 201 supplies the signals s22 as parallel signals s21 together with the parity bit p20 to the parallel/serial converting circuit 203.

The timing generating circuit 202 generates a timing signal t20 in a predetermined cycle (frame cycle).

The parallel/serial converting circuit 203 is supplied with the parallel signals s22 and the parity bit p20 from the parity generating circuit 201 and multiplexes the parallel signals s22 and the parity bit p20 at a timing of the timing signal t20 to produce a serial signal s23 as an error detecting code signal. The serial signal s23 is delivered to the intercommunicating portion 1 side 21 as a mate system.

In the intercommunicating portion 1 side 21, the serial/parallel converting circuit 211 is supplied with the serial signal s23 from the intercommunicating portion 0 side 20 as the mate system. The serial/parallel converting circuit 211 produces received parallel signals s24, a received parity signal p21, and a parity check timing signal t21 obtained by reproducing the timing signal t20 of the mate system (0 side).

The parity checking circuit 212 checks parity of the received parallel signals s24 by the use of the received parity signal p21 at a timing of the parity check timing signal t21. When the parity of the received parallel signals s24 is valid, the parity checking circuit 212 makes the state holding circuit 213 hold checked parallel signals s25, which are identical with the received parallel signals s24, as the operating state information. On the other hand, upon occurrence of an error in the parity of the received parallel signals s24, the parity checking circuit 212 produces a clear signal c21 to clear the held content of the state holding circuit 213.

The state holding circuit 213 continuously holds the checked parallel signals s25 which is updated in response to the parity check timing signal t21 as far as the parity of the received parallel signals s24 is valid. Furthermore, the state holding circuit 213 produces as the mate state output signal (or reproduced intercommunicating signals) s26 those signals representative of the state of the mate system.

When the parity error or the like is detected, the state holding circuit 213 de-asserts the output signals in response to the clear signal c21 from the parity checking circuit 212. In other words, the state holding circuit 213 produces the mate state output signals s26 of a high level when it is cleared by the clear signal c21. This is because the operation mode signals s21 including ACTN, SYCN, and RUNN has a negative logic. However, if the receiving side driver is in the standby system, the state holding circuit 213 may maintain the held content updated at the last timing of the parity check timing signal p21.

Additionally, the parity generating circuit 201, the timing generating circuit 202, the parallel/serial converting circuit 203, the serial/parallel converting circuit 211, the parity checking circuit 212, and the state holding circuit 213 illustrated in FIG. 1 are well known to those skilled in the art and have no direct concern with this invention. Therefore, the detailed description of their structures is omitted herein.

Next, description will be made of the operation of the duplex intercommunicating apparatus of this embodiment with reference to the time chart of the operation timing illustrated in FIG. 4 in conjunction with the case where the operation mode signals are transmitted from the 0 system 20 to the 1 system 21 of FIG. 2.

In the intercommunicating portion 0 side (0 system) 20, the parallel/serial converting circuit 203 samples the parallel signals s22 (i.e. ACTN, SYCN and RUNN) and the parity bit p20 at the timing of the timing signal t20 having the predetermined frame cycle. The parallel/serial converting circuit 203 produces a start bit at each leading edge (t1, t3) of the timing signal t20, then successively produces an ACTN bit, an SYCN bit, an RUNN bit, and Parity bit on the basis of the sampled parallel signals s22 and the sampled parity bit p20, and assembles these bits into a single frame to be produced as the serial signal s23. The serial signal s23 is transmitted to the intercommunicating portion 1 side (1 system) 21 as the mate system. Herein, the cycle of the generated timing signal t20 is not shorter than a single frame (or the total bit width of the above-mentioned bets) of the serial signal s23.

On the other hand, in the 1 system 21, the serial/parallel converting circuit 211 is supplied with the serial signal s23 and detects the Start bit to obtain the timing (t1, t3). The timing (t1, t3) is used for not only detecting the parallel signals s24 and the parity signal p21 from the serial signal s23 but also for deciding the parity check timing (t2, t4) after predetermined time from the timing (t1, t3). The serial/parallel converting circuit 211 reproduces the parallel signals s24 including ACTN, SYCN and RUNN and the parity signal and produces the parity check timing signal t21.

The parity checking circuit 212 carries out the parity checking operation in synchronism with the parity check timing signal t21. In absence of a parity error, the memory content of the state holding circuit 213 is updated at the timing (t2, t4) of the parity check timing signal t21. In presence of the parity error, the held content held in the state holding circuit 213 is cleared by the clear signal c21 and the output signals s26 of the state holding circuit 213 has high level though such a situation does not illustrated in FIG. 4.

When the processor board receives the output signals s26 having the high level, it acts in a system without the mate.

The above-mentioned operation is only for transmission from the 0 system to the 1 system as illustrated in FIG. 2. However, because this is the circuit in the intercommunicating apparatus, the similar operation is carried out in the other circuits for transmitting the signal from the 1 system to the 0 system.

This embodiment is advantageously used as the intercommunicating apparatus of the duplex processor apparatus in which the operation mode of the active system during operation is memorized in the state holding circuit of the standby system and the operation is immediately started in the operation mode as the memorized content upon switching from the standby system into the active system. That is, according to this embodiment, it is possible to reliably carry out a control for switching from the standby system into the active system.

Furthermore, in each intercommunicating portion of this embodiment, the parity error is utilized as described above. In this manner, it is possible to determine whether or not the signal representative of being the active system is abnormal and to avoid the abnormality such that the active system is indefinite.

In addition, according to this embodiment, it is possible to check the normality of the intercommunicating portions between the mates and to smoothly switch the active system and the standby system from one to another.

In case where the signal line is fixed to the high level state or the low level state due to the failure in the printed wiring board or the back wiring board, the normality of the intercommunicating signals between the mates is checked by the redundant bit(s). It is therefore possible to avoid the problem that the active system can not be identified, state setting can not be made, and a starting system can not be determined due to the abnormality in operation modes of the duplex processor boards. If the starting system can not be determined, the duplex processor apparatus is put into a system-down state. According to this embodiment, it is possible to shorten the system-down period of the duplex processor apparatus.

In particular, in the duplex processor apparatus, it is assumed that a processor board is inserted into a module in order to change the system structure in a simplex operation into a duplex structure. In this event, it is possible to suppress the system down due to the abnormality in system structure caused upon occurrence of high-level stack or low-level stack in the intercommunicating signals supplied from the processor board.

In this embodiment, the intercommunicating signals between the mates are multiplexed into the serial signal so that the number of signals is reduced. Therefore, the number of points where a production defect is produced is also reduced.

Furthermore, since the number of signals is reduced, the number of driver components is reduced. The reduction in number of the signals on the back wiring board results in reduction of the number of layers of the back wiring board. Thus, this structure is also effective in lowering the system cost.

Figure 5:
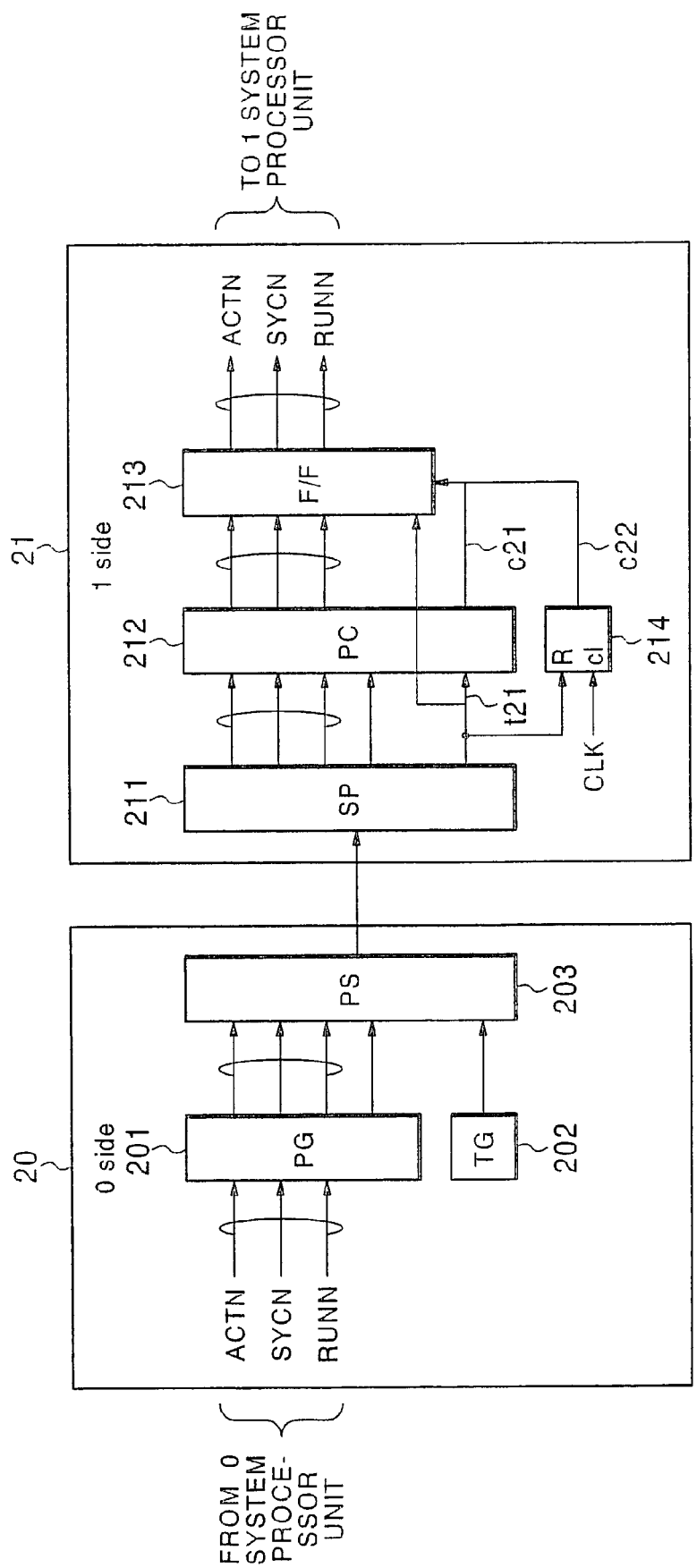
FIG. 5 is a block diagram of another intercommunicating apparatus according to another embodiment of this invention.

Referring to FIG. 5, the description will be made about another intercommunicating apparatus according to another embodiment of this invention.

In FIG. 5, the 1 system 21 further comprises a timer circuit 214 connected to a clock generator (not show) at a clock terminal cl, to the serial/parallel converting circuit 211 at a reset terminal R, and to the state holding circuit 213. The timer circuit 214 is supplied with a clock signal (CLK) from the clock generator via the clock terminal cl and with the parity check timing signal t21 from the serial/parallel converting circuit 211 via the reset terminal R. The timer circuit 214 counts pulses of the clock signal to produce the counted value which is reset by the parity check timing signal t21. Further, the timer circuit 214 compares the counted value with the predetermined value which is previously set into the timer circuit 214. The predetermined value is decided so that a time period represented thereby is longer than the cycle of the parity check timing signal t21. Accordingly, the counted value does not reach the predetermined value as long as normal operations of the duplex processor apparatus and the intercommunication apparatus is normally carried out. When the parity check timing signal t21 is not produced for the time period representative of the predetermined value, the counted value reaches the predetermined value. When the counted value is equal to the predetermined value, the timer circuit 214 produces a time out signal c22 to clear the held content of the state holding circuit 213.

Thus, an abnormal operation of the duplex processor apparatus can be avoided in a case where an operation error in production of the parity check timing signal t21. The operation error is caused by, for example, disconnection of the processor board of the mate system.

While this invention has thus far been described in conjunction with a few embodiments thereof, it will readily be possible for those skilled in the art to put this invention into practice in various other manners. For example, the redundancy bit producing circuit may use an error correcting code or a cyclic redundancy check (CRC) code so as to correct the error on the serial signal s23.

Furthermore, the intercommunicating signals s21 may include a signal(s) for preventing the system down of the duplex processor apparatus and/or for suppressing a system down period in the duplex processor apparatus than the operation mode signals. For example, the signals s21 include a signal defining an emergency operation.

What is claimed is:

1. A method for transmitting a plurality of intercommunicating signals parallel to one another from a first processor unit to a second processor unit of a duplex processor apparatus, said method comprising the steps of:
    changing said intercommunicating signals supplied from said first processor unit into a serial signal having a redundancy data structure;
    reproducing said intercommunicating signals in the form of parallel signals from said serial signal; and
    supplying the reproduced intercommunicating signals to said second processor unit, wherein,
    said step of changing said intercommunicating signals into a serial signal having a redundancy data structure is conducted at a transmitting portion of a duplex processor apparatus at a timing of a first timing signal,
    said intercommunicating signals comprises parallel operation mode signals which include an ACTN signal representative of being an active system, a SYCN signal representative of being in a duplex operation, and a RUNN signal representative of a processor being in execution, the operation mode signals defining active and standby systems in a duplex processor apparatus,
    prior to said reproducing step, the further step of sending the serial output signal to a receiving portion of the duplex processor apparatus,
    said reproducing step further produces a parity check timing signal obtained by reproducing the first timing signal, and
    at the receiving portion, the further step of, with said reproduced redundancy data, evaluating said redundancy data for an error in said reproduced intercommunicating signals.

2. A method as claimed in claim 1, said serial signal comprising an error detecting code signal, said method further comprising the steps of:
    detecting an error on said error detecting code signal, and
    suspending supply of said reproduced intercommunicating signals to said second processor unit when said error is detected.

3. A method as claimed in claim 1, wherein said changing step comprises the steps of:
    producing at least one redundancy bit on the basis of said intercommunicating signals, and
    multiplexing said intercommunicating signals and said redundancy bit(s) in a predetermined cycle to produce said serial signal,
    said reproducing step comprising the steps of:
    demultiplexing said serial signal into received intercommunicating signals and received redundancy bit(s),
    detecting an error on said received intercommunicating signals by the use of said received redundancy bit(s), and
    holding said received intercommunicating signals in a signal holding circuit to supply said received intercommunicating signals as said reproduced intercommunicating signals to said second processor unit.

4. A method as claimed in claim 3, wherein said reproducing step further comprises the step of:
  clearing held content held in said signal holding circuit to suspend supply of said reproduced intercommunicating signals to the second processor unit when said error is detected.

5. A method as claimed in claim 3, wherein said redundancy bit comprises a parity bit.

6. A method as claimed in claim 3, wherein said redundancy bit(s) generated by use of an error correction code or a cyclic redundancy check code.

7. A method as claimed in claim 3, wherein said changing step further comprises the step of:
  generating a timing signal to decide said predetermined cycle.

8. A method as claimed in claim 3, wherein said reproducing step further comprises the steps of:
  clearing held content held in said signal holding circuit to suspend supply of said reproduced intercommunicating signals to the second processor unit when said serial signal is not received for a predetermined time period.

9. A method, as claimed in claim 1, wherein said parity signal not being supplied to said second processor unit.

10. A method as claimed in claim 9, said serial signal comprising an error detecting code signal, said method further comprising the steps of:
  detecting an error on said error detecting code signal, and
  suspending supply of said reproduced intercommunicating signals to said second processor unit when said error is detected.

11. A method as claimed in claim 9, wherein said changing step comprises the steps of:
  producing at least one redundancy bit on the basis of said intercommunicating signals, and
  multiplexing said intercommunicating signals and said redundancy bit(s) in a predetermined cycle to produce said serial signal,
  said reproducing step comprising the steps of:
  demultiplexing said serial signal into received intercommunicating signals and received redundancy bit(s),
  detecting an error on said received intercommunicating signals by the use of said received redundancy bit(s), and
  holding said received intercommunicating signals in a signal holding circuit to supply said received intercommunicating signals as said reproduced intercommunicating signals to said second processor unit.

12. A method as claimed in claim 11, wherein said reproducing step further comprises the step of:
  clearing held content held in said signal holding circuit to suspend supply of said reproduced intercommunicating signals to the second processor unit when said error is detected.

13. A method as claimed in claim 11, wherein said redundancy bit comprises a parity bit.

14. A method as claimed in claim 11, wherein said redundancy bit(s) generated by use of an error correction code or a cyclic redundancy check code.

15. A method as claimed in claim 11, wherein said changing step further comprises the step of:
  generating a timing signal to decide said predetermined cycle.

16. A method as claimed in claim 11, wherein said reproducing step further comprises the steps of:
  clearing held content held in said signal holding circuit to suspend supply of said reproduced intercommunicating signals to the second processor unit when said serial signal is not received for a predetermined time period.

17. A method for transmitting a plurality of intercommunicating signals parallel to one another from a first processor unit to a second processor unit of a duplex processor apparatus, said method comprising the steps of:
  at a transmitting portion of a duplex processor apparatus, at a timing of a first timing signal, changing a set of plural parallel intercommunicating signals supplied from a first processor unit into a serial output signal having a redundancy data structure, said supplied parallel intercommunicating signals comprising operation mode signals which include an ACTN signal representative of being an active system, a SYCN signal representative of being in a duplex operation, and a RUNN signal representative of a processor being in execution, the operation mode signals defining active and standby systems in a duplex processor apparatus;
  sending the serial output signal to a receiving portion of the duplex processor apparatus;
  at the receiving portion, reproducing, from said serial signal, said intercommunicating signals and said redundancy data in the form of parallel signals;
  with said reproduced redundancy data, evaluating said redundancy data for an error in said reproduced intercommunicating signals; and
  supplying the reproduced intercommunicating signals to said second processor unit.

18. The method of claim 17, further comprising the steps of:
  generating said redundancy data structure as a parity bit;
  upon said evaluating step detecting the error in said reproduced intercommunicating signals, suspending supply of said reproduced intercommunicating signals to said second processor unit;
  said supplying step including supplying said reproduced intercommunicating signals, as a held content, to a state holding circuit for holding an operating state information of the first processor as a mate system; and
  upon said evaluating step detecting the error in said reproduced intercommunicating signals, producing a clear signal to clear the held content of the state holding circuit.

19. The method of claim 18, further comprising the steps of:
  at the receiving portion, said step of reproducing said intercommunicating signals and said redundancy data in the form of parallel signals from said serial signal further produces a parity check timing signal obtained by reproducing the first timing signal;
  said step of evaluating said redundancy data for an error carries out a parity checking operation in synchronism with the parity check timing signal;
  in an absence of any parity error, the held content in the state holding circuit is updated at the timing of the parity check timing signal; and
  in a presence of the parity error, the held content in the state holding circuit is cleared by the clear signal.

* * * * *